United States Patent
Teramoto et al.

(10) Patent No.: US 8,583,717 B2
(45) Date of Patent: Nov. 12, 2013

(54) SIGNAL PROCESSING CIRCUIT

(75) Inventors: Kohei Teramoto, Tokyo (JP); Masaru Kimura, Tokyo (JP); Tsuyoshi Nakada, Tokyo (JP); Fuminori Saito, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 486 days.

(21) Appl. No.: 13/003,738

(22) PCT Filed: Sep. 24, 2009

(86) PCT No.: PCT/JP2009/004814
§ 371 (c)(1),
(2), (4) Date: Jan. 11, 2011

(87) PCT Pub. No.: WO2010/041381
PCT Pub. Date: Apr. 15, 2010

(65) Prior Publication Data
US 2011/0113081 A1    May 12, 2011

(30) Foreign Application Priority Data

Oct. 6, 2008 (JP) ................................. 2008-259728

(51) Int. Cl.
*G06F 17/10* (2006.01)
(52) U.S. Cl.
USPC ......................................... 708/320; 708/319
(58) Field of Classification Search
USPC ................................................ 708/319–320
See application file for complete search history.

(56) References Cited

U.S. PATENT DOCUMENTS

| 5,255,215 A | 10/1993 | Sakata et al. |
| 6,177,897 B1 | 1/2001 | Williams, III |
| 2006/0031276 A1 | 2/2006 | Kumamoto et al. |
| 2011/0022650 A1* | 1/2011 | Spiegel et al. ................ 708/319 |

FOREIGN PATENT DOCUMENTS

| JP | 63-224408 A | 9/1988 |
| JP | 3-204216 A | 9/1991 |
| JP | 6-97777 A | 4/1994 |
| JP | 11-284491 A | 10/1999 |
| JP | 2005-65231 A | 3/2005 |
| JP | 2007-537630 A | 12/2007 |
| WO | 2005-109640 A1 | 11/2005 |

OTHER PUBLICATIONS

Adaptive IIR Filter Initialization via Hybrid FIR/IIR Adaptive Filter Combination, Pasquato & Kale, 2001 IEEE, pp. 1830-1835.

* cited by examiner

*Primary Examiner* — Tan V. Mai
(74) *Attorney, Agent, or Firm* — Birch, Stewart, Kolasch & Birch, LLP

(57) ABSTRACT

A signal processing circuit has two types of filters: an IIR filter 11 and an FIR filter 12 having an equivalent transfer function at all times. In an adjustment mode in which the signal processing circuit is adjusted to have an arbitrary transfer function, the signal processing circuit makes a configuration setting to use the IIR filter 11. When completing the adjustment or in a signal processing mode, the signal processing circuit makes a configuration setting change to switch to the FIR filter 12 having the equivalent transfer function.

5 Claims, 4 Drawing Sheets

SIGNAL PROCESSING CIRCUIT

FIELD OF THE INVENTION

The present invention relates to a signal processing circuit suitable for use in a purpose of processing an audio signal in digital signal processing.

BACKGROUND OF THE INVENTION

As digital filters, the following two types of filters: an IIR (Infinite Impulse Response) filter and an FIR (Finite Impulse Response) filter are usually known. A signal flowchart showing an algorithm of signal processing by an IIR filter is shown in FIG. 3, and a signal flow chart showing an algorithm of signal processing by an FIR filter is shown in FIG. 4.

As shown in FIG. 3, the IIR filter is comprised of an IIR coefficient output unit 30 which outputs a filter coefficient corresponding to the transfer function of the IIR filter, adders 31 and 32, multipliers 33 to 37, and delay units 38 and 39. The IIR filter has a feature of making it easy to set an arbitrary frequency characteristic thereto, and provides a low level of arithmetic precision since the IIR filter has a feedback loop, as shown in FIG. 3, and therefore operation errors are accumulated therein.

In contrast with this, the FIR filter is comprised of an FIR coefficient output unit 40 which outputs a filter coefficient corresponding to the transfer function of the FIR filter, an adder 41, multipliers 42 to 44, and delay units 45 and 46, as shown in FIG. 4. Because the FIR filter completes a set of multiplication and addition only once per each filter coefficient for each signal, the FIR filter provides a high level of arithmetic precision with no accumulation of errors, though the FIR filter has a feature of having difficulty in adjusting its frequency characteristic, such as changing only apart of the frequency characteristic, and hence having unease of adjustment.

Conventionally, in order to reduce quantization noise occurring in a D/A (Digital/Analog) converter, a hybrid FIR/IIR filter configuration, which is a combination of an IIR filter function and an FIR filter function, for filtering the quantization output of the D/A converter is known (for example, refer to patent reference 1). Furthermore, a design method of calculating an FIR filter coefficient by measuring an impulse response of an IIR filter without carrying out a complicated arithmetic operation, such as an arithmetic computation of a polynomial or an inverse DFT, is also known (for example, refer to patent reference 2).

RELATED ART DOCUMENT

Patent Reference
Patent reference 1: JP,11-284491,A
Patent reference 2: JP,6-97777,A

SUMMARY OF THE INVENTION

According to the technology disclosed by above-mentioned patent reference 1, a circuit which is formed by combining the FIR filter function and the IIR filter function has a fewer required number of taps than that of a conventional FIR method, and a smaller required region than that of an IIR filter.

However, the above-mentioned hybrid FIR/IIR filter is not used with switching between the FIR filter and the IIR filter being performed. Therefore, the hybrid FIR/IIR filter does not have both ease of adjustment which an IIR filter has, and a high degree of precision with few operation errors which an FIR filter has.

Furthermore, according to the method disclosed by above-mentioned patent reference 2, an FIR filter having a linear phase characteristic and a frequency amplitude characteristic which is the square of the frequency amplitude characteristic of the IIR filter can be designed. A problem is, however, that in a frequency correction used well, such as a correction for emphasizing a low-frequency region, it is known that the IIR filter must have an extremely long response time to implement the frequency characteristic, and, as a result, the group delay frequency characteristic of the FIR filter which is calculated from the extremely long response time of the IIR filter becomes very long and is therefore inapplicable to an audio/video system with a high level of real-time nature which cannot permit a long delay.

A further problem is that because the FIR filter acquired above has the amplitude characteristic which is the square of that of the IIR filter, a frequency correction using this FIR filter results in an excessive correction and the ease of adjustment is impaired. For example, a correction of 6 dB using the IIR filter corresponds to a correction of 12 dB using the FIR filter.

The present invention is made in order to solve the above-mentioned problems, and it is therefore an object of the present invention to provide a high-performance signal processing circuit having both ease of adjustment which an IIR filter has, and a high degree of precision with few operation errors which an FIR filter has.

In order to solve the above-mentioned problems, a signal processing circuit in accordance with the present invention includes: an IIR filter and an FIR filter, each for processing a digital signal according to a filter coefficient which is set in such a way as to correspond to a transfer function; an IIR filter coefficient storage unit for storing a filter coefficient of the above-mentioned IIR filter; a filter coefficient conversion unit for creating an FIR filter coefficient having a same transfer function as the IIR filter coefficient from the above-mentioned IIR filter coefficient stored in the above-mentioned IIR filter coefficient storage unit; an FIR filter coefficient storage unit for storing the FIR filter coefficient created by the above-mentioned filter coefficient conversion unit; and a control unit for enabling the above-mentioned IIR filter at a time of adjustment of the above-mentioned transfer function to control the above-mentioned filter coefficient conversion unit to cause the above-mentioned filter coefficient conversion unit to create the FIR filter coefficient having the same transfer function as the above-mentioned IIR filter coefficient, and for enabling the above-mentioned FIR filter at a time of signal processing or at a time of completion of the above-mentioned adjustment.

According to the present invention, there can be provided a high-performance signal processing circuit having both ease of adjustment which an IIR filter has, and a high degree of precision with few operation errors which an FIR filter has.

EMBODIMENTS OF THE INVENTION

Hereafter, in order to explain this invention in greater detail, the preferred embodiments of the present invention will be described with reference to the accompanying drawings.

Embodiment 1

Figure 1:
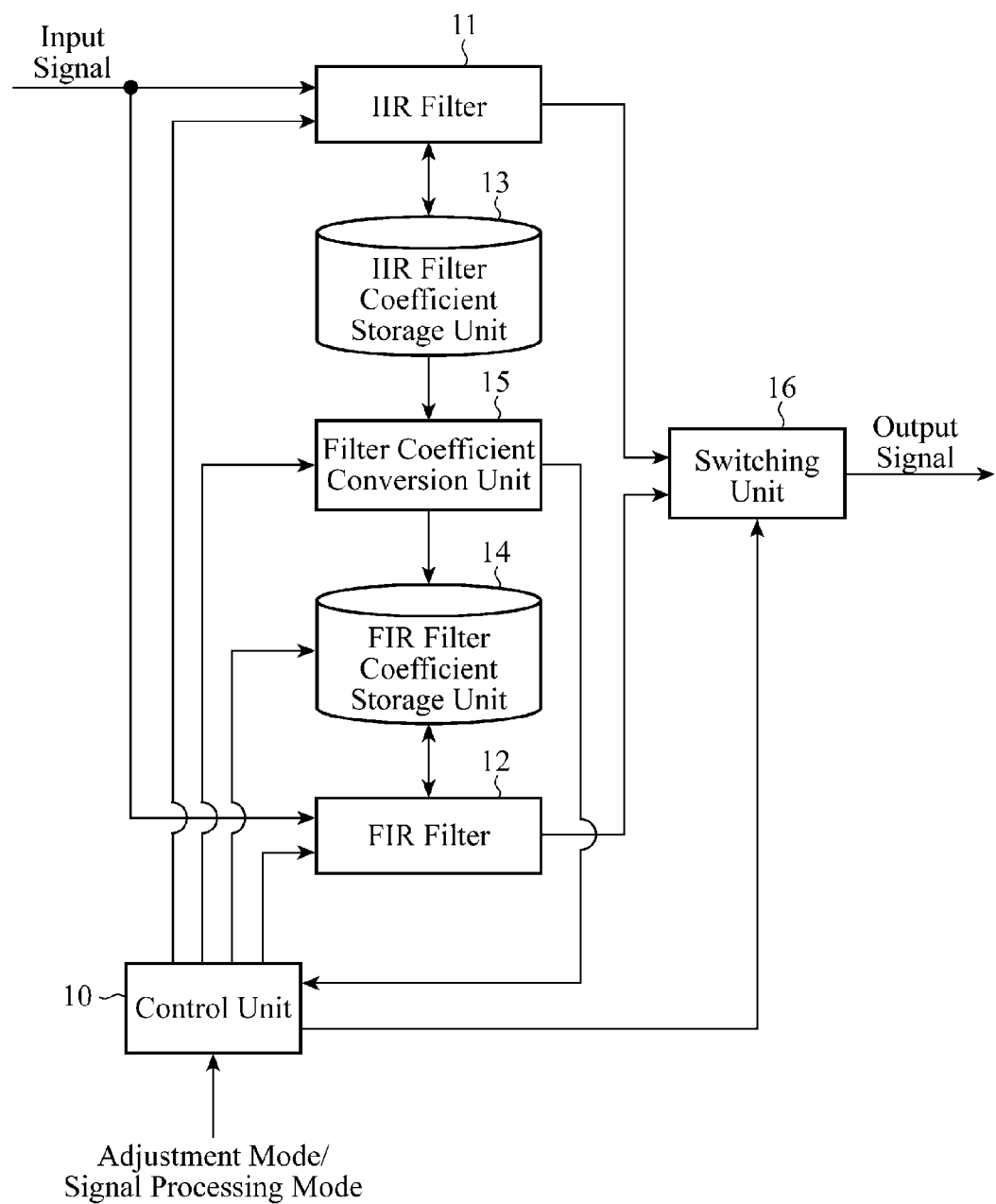
FIG. 1 is a block diagram showing the internal structure of a signal processing circuit in accordance with Embodiment 1 of the present invention.

FIG. 1 is a block diagram showing the internal structure of a signal processing circuit in accordance with Embodiment 1 of the present invention.

As shown in FIG. 1, the signal processing circuit in accordance with Embodiment 1 of the present invention is comprised of a control unit 10, an IIR filter 11, an FIR filter 12, an IIR filter coefficient storage unit 13, an FIR filter coefficient storage unit 14, a filter coefficient conversion unit 15, and a switching unit 16.

The IIR filter 11 has a feature of making it easy to set an arbitrary frequency characteristic thereto, as described above, and provides a low level of arithmetic precision because operation errors are accumulated therein since the IIR filter has a feedback loop. In contrast with this, because the FIR filter 12 completes a set of multiplication and addition only once per each filter coefficient for each signal, the FIR filer 12 provides a high level of arithmetic precision with no accumulation of errors, though the FIR filter 12 has a feature of having difficulty in adjusting its frequency characteristic, such as changing only a part of the frequency characteristic.

Each of the IIR filter 11 and the FIR filter 12 is provided to process a digital signal according to a filter coefficient set according to a transfer function. For example, each of the IIR filter 11 and the FIR filter 12 is mounted in a DSP (Digital Signal Processor).

An IIR filter coefficient of the IIR filter 11 is stored in the IIR filter coefficient storage unit 13, and an FIR filter coefficient created by the filter coefficient conversion unit 15 is stored in the FIR filter coefficient storage unit 14.

The filter coefficient conversion unit 15 creates the FIR filter coefficient having the same transfer function as the IIR filter coefficient from the IIR filter coefficient stored in the IIR filter coefficient storage unit 13 under the control of the control unit 10. The filter coefficient conversion unit 15 creates the FIR filter coefficient having the same transfer function as the IIR filter coefficient from the IIR filter coefficient by using an impulse response measured under the control of the control unit 10 or by performing an arithmetic operation such as an inverse Fourier transform.

The control unit 10 has a configuration setting control function of determining whether to enable either the IIR filter 11 or the FIR filter 12 to make one of them operate and a function of controlling the filter coefficient conversion unit 15 to cause this filter coefficient conversion unit 15 to create the FIR filter coefficient having the same transfer function as the IIR filter coefficient and then store the created FIR filter coefficient in the FIR filter coefficient storage unit 14.

More specifically, the control unit 10 enables the IIR filter 11 via the switching unit 16 according to a selection operation performed by a user at the time of adjustment of the transfer function (in an adjustment mode), and controls the filter coefficient conversion unit 15 to cause this filter coefficient conversion unit to create the FIR filter coefficient having the same transfer function as the IIR filter coefficient. Furthermore, the control unit 10 enables the FIR filter 12 via the switching unit 16 according to a selection operation performed by the user at the time of signal processing (in a signal processing mode) or at the time of the completion of the adjustment.

The control unit 10, the IIR filter coefficient storage unit 13, the FIR filter coefficient storage unit 14, the filter coefficient conversion unit 15, and the switching unit 16, which are mentioned above, can be mounted in an MPU (Micro Processor) including a memory, for example.

In this case, the IIR filter coefficient storage unit 13 and the FIR filter coefficient storage unit 14 are assigned to the memory, and the IIR and FIR filter coefficients are stored in the memory. The memory can be mounted outside the signal processing circuit.

Figure 2:
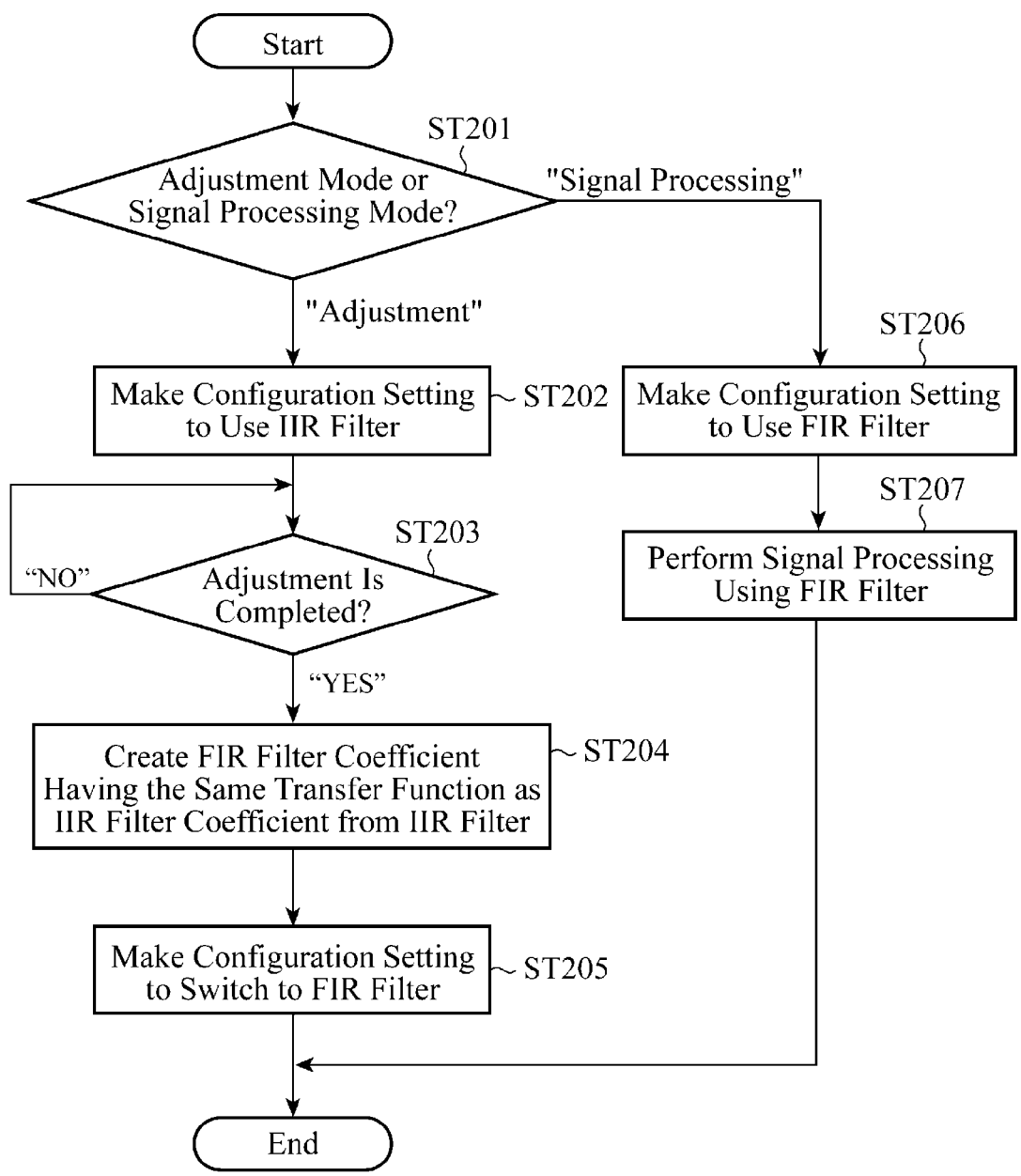
FIG. 2 is a flow chart showing the operation of the signal processing circuit in accordance with Embodiment 1 of the present invention.
Figure 3:
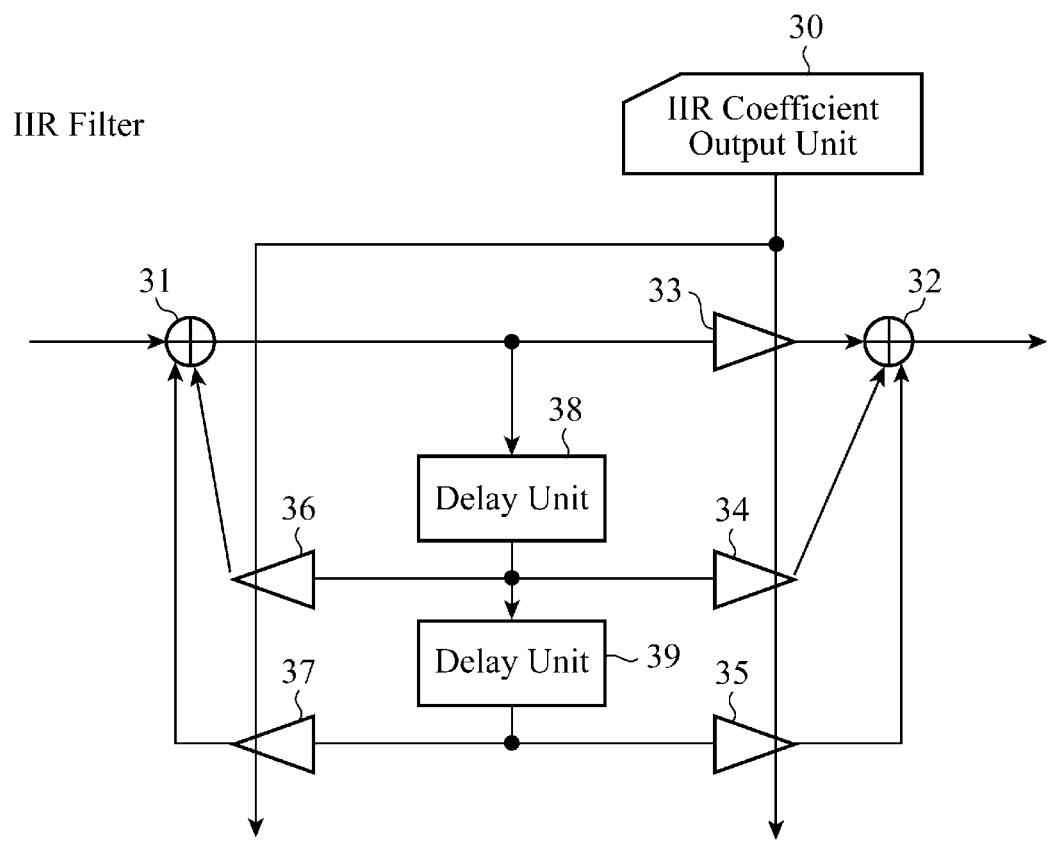
FIG. 3 is a signal flow view showing a signal processing algorithm of an IIR filter.
Figure 4:
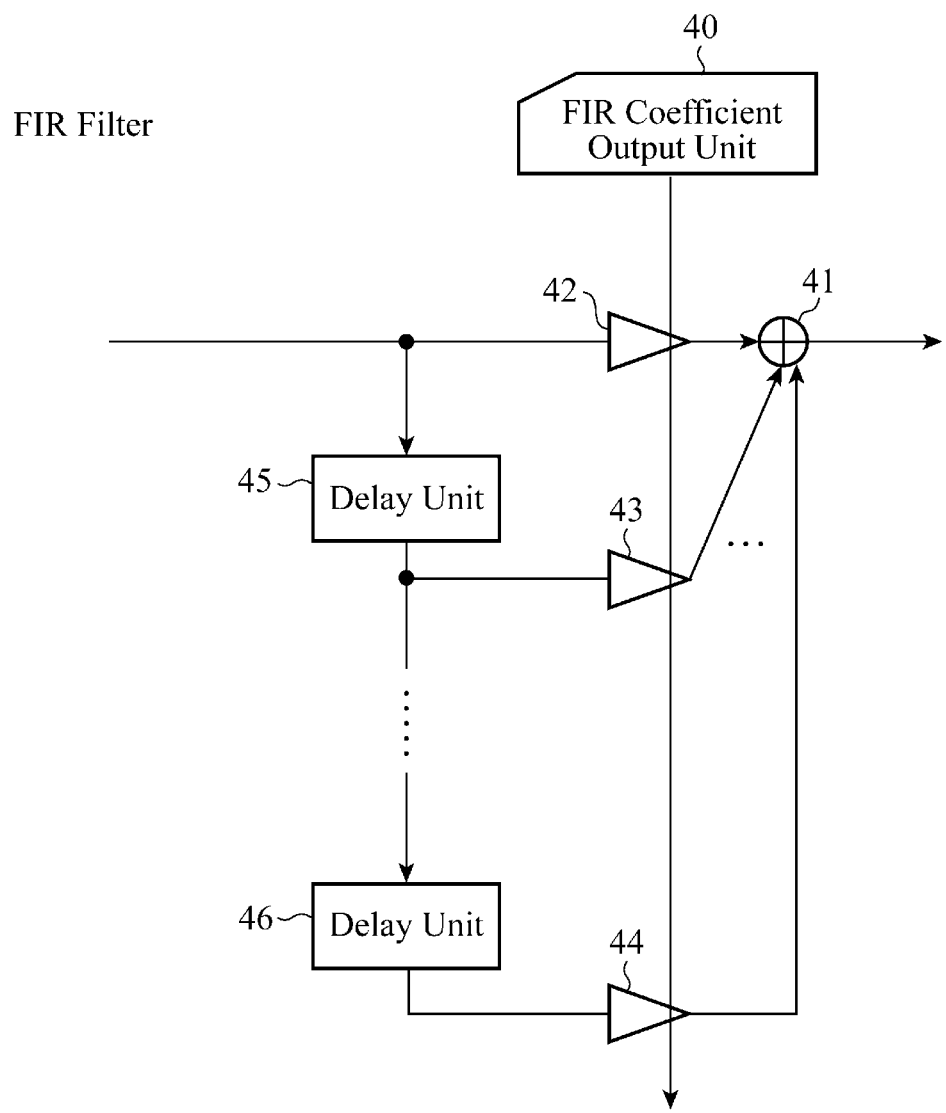
FIG. 4 is a signal flow view showing a signal processing algorithm of an FIR filter.

FIG. 2 is a flow chart showing the operation of the signal processing circuit in accordance with Embodiment 1 of the present invention.

Hereafter, the operation of the signal processing circuit in accordance with Embodiment 1 of the present invention shown in FIG. 1 will be explained in detail with reference to the flow chart of FIG. 2.

In the adjustment mode in which the signal processing circuit is adjusted to have an arbitrary transfer function ("adjustment" in step ST201), the control unit 10 makes a configuration setting for enabling the IIR filter 11 first (step ST202). More specifically, the signal processing circuit is placed in the adjustment mode in which the IIR filter 11 is selected by the switching unit 16 in such a way as to be enabled to operate.

The control unit 10 then determines whether or not the adjustment has been completed (step ST203), and, if NO, repeats the adjustment, whereas if YES, the control unit 10 controls the filter coefficient conversion unit 15 to create the FIR filter coefficient having the same transfer function as the IIR filter coefficient according to the IIR filter coefficient stored in the IIR filter coefficient storage unit 13 (step ST204). The FIR filter coefficient created is stored in the FIR filter coefficient storage unit 14 by the control unit 10.

When the filter coefficient conversion unit 15 creates the FIR filter coefficient having the same transfer function as the IIR filter coefficient, the control unit 10 inputs an impulse signal into the filter coefficient conversion unit 15 and then measures an impulse response to the impulse signal.

More specifically, the control unit 10 assumes that the signal processing circuit which is temporarily configured and set to serve as the IIR filter 11 is a black box, and inputs an impulse signal to the signal processing circuit and then measures an impulse response to the impulse signal. This impulse response is equivalent to the calculation of the filter coefficient of the IIF filter 11, as well known. Therefore, by configuring and setting the FIR filter 12 in such away that the FIR filter has a coefficient having this value, the characteristic (transfer function) equivalent to the IIR filter 11 can be implemented by the FIR filter 12.

In this case, the FIR filter coefficient having the same transfer function as the IIR filter coefficient is created from the impulse response, though when the time length required to carry out the processing is relatively not significant, the control unit 10 can calculate the filter coefficient by using a well-known arithmetic operation, such as a numerical computation of a polynomial or an inverse DFT (IDFT: Inverse Discrete Fourier Transform).

Next, the control unit 10 makes a configuration setting change to switch to the FIR filter having the same transfer function as the IIR filter, the transfer function being created by the filter coefficient conversion unit 15 (step ST205). More specifically, the signal processing circuit makes a transition to a state in which the FIR filter 12 having the same transfer function as the filter coefficient of the IIR filter 11 is selected by the switching unit 16 in such a way as to be enabled to carry out the signal processing.

Furthermore, when it is determined in the mode determination process of step ST201 that the signal processing circuit is placed in the signal processing mode ("signal processing" in step ST201), the control unit 10 makes a configuration setting to use the FIR filter 12 (step ST206), and controls the switching unit 16 to command the signal processing circuit to start the signal processing using the FIR filter 12 (step ST207).

At the time of readjustment, the control unit 10 makes a configuration setting change to switch to the configuration using the IIR filter 11 again, and, after the re-configuration, replaces the configuration setting with the configuration setting using the FIR filter 12 having the same transfer function again.

The above-mentioned signal processing circuit in accordance with Embodiment 1 of the present invention provides the following two types of filter coefficients: the filter coefficients of the IIR filter 11 and the FIR filter 12 having the same transfer function at all times, and, in the adjustment mode in which the signal processing circuit is adjusted to have an arbitrary transfer function, makes a configuration setting to use the IIR filter 11, and, at the time of the completion of the adjustment or in the signal processing mode, makes a configuration setting change to switch to the FIR filter 12 having the same transfer function as the IIR filter. Therefore, the signal processing circuit in accordance with Embodiment 1 of the present invention can provide both ease of adjustment which the IIR filter 11 has, and a high degree of precision with few operation errors which the FIR filter 12 has.

Furthermore, because the signal processing circuit in accordance with Embodiment 1 of the present invention automatically creates the filter coefficient of the FIR filter 12 having a transfer function equivalent to that of the IIR filter 11 which enables signal propagation in real time by using the IIR filter 11, the signal processing circuit can create the FIR filter coefficient in a short time, and can reduce the arithmetic load thereon.

The above-mentioned signal processing circuit in accordance with Embodiment 1 of the present invention creates the FIR filter coefficient having a transfer function equivalent to that of the IIR filter 11 by measuring an impulse response. In a case in which the time length required to carry out the processing is not significant, the signal processing circuit can alternatively carry out a numerical computation of a polynomial or an IDFT arithmetic operation by using the control unit 10.

Furthermore, when the impulse response is too long, the control unit 10 can also reduce the amount of arithmetic operation effectively by carrying out a convolution arithmetic operation using a window function appropriate to the impulse response. As a window function appropriate to the impulse response, a rectangular window, a Gaussian window, a humming window, or the like can be used.

Furthermore, when the impulse response is long, the control unit performs a frequency conversion operation on the FIR filter coefficient and the input signal and then multiplies the frequency-converted FIR filter by the frequency-converted input signal on the frequency axis by using the fact that a filter arithmetic operation on the time axis is equivalent to a multiplication on the frequency axis, thereby being able to further reduce the amount of arithmetic operation.

The filtering on the frequency axis can be implemented by using an arithmetic operation method which is well known as Overlap-add or Overlap-save.

Furthermore, all the functions which the control unit 10 shown in FIG. 1 has can be implemented via software, or at least a part of the functions can be implemented via hardware.

For example, the data process of enabling the IIR filter 11 and controlling the filter coefficient conversion unit 15 to cause this filter coefficient conversion unit to create the FIR filter coefficient having the same transfer function as the IIR filter coefficient at the time of adjustment of the transfer function, and enabling the FIR filter 12 at the time of signal processing or at the time of the completion of the adjustment can be implemented on a computer by one or more programs, and at least a part of them can be implemented via hardware.

Industrial Applicability

Because the signal processing circuit in accordance with the present invention can provide high performance including ease of adjustment which an IIR filter has and a high degree of precision with few operation errors which an FIR filter has, the signal processing circuit in accordance with the present invention is suitable for use as a signal processing circuit or the like which is suited to processing an audio signal with digital signal processing.

The invention claimed is:

1. A signal processing circuit comprising:
    an IIR ("Infinite Impulse Response") filter and an FIR ("Finite Impulse Response") filter, each configured to process a digital signal according to a filter coefficient which is set to correspond to a transfer function;
    a filter coefficient conversion unit configured to generate a FIR filter coefficient having a same transfer function as an IIR filter coefficients of the IIR filter by using the IIR filter; and
    a control unit configured to determine which one of the IIR filter and the FIR filter is available for processing the digital signal, wherein,
    when adjusting the transfer function, the control unit controls the IIR filter to be available and controls the filter coefficient conversion unit to generate the FIR filter coefficient having the same transfer function as the IIR filter coefficient, and
    when finishing adjusting the transfer function or when implementing a signal processing, the control unit controls a FIR filter to be available, which is utilized for processing the digital signal according to the FIR filter coefficient generated by the filter coefficient conversion unit.

2. The signal processing circuit according to claim 1, further comprising an FIR filter coefficient storage unit configured to store the FIR filter coefficient generated by the filter coefficient conversion unit,
    wherein the control unit inputs an impulse signal to the filter coefficient conversion unit, and stores an impulse response measured in the FIR filter coefficient storage unit as the FIR filter coefficient having the same transfer function as the IIR filter coefficient.

3. The signal processing circuit according to claim 2, wherein said control unit performs a convolution arithmetic operation with a predetermined window function on said impulse response when said impulse response exceeds a fixed time length threshold.

4. The signal processing circuit according to claim 2, wherein when said impulse response exceeds a fixed time length threshold, said control unit performs frequency conversion on the input signal and the FIR filter coefficient stored in said FIR filter coefficient storage unit, and multiplies the frequency-converted input signal by the frequency-converted FIR filter coefficient.

5. The signal processing circuit according to claim 1, further comprising an IIR filter coefficient storage unit configured to store the filter coefficient of the IIR filter,
   wherein the control unit converts the IIIZ filter coefficient stored in the IIR filter coefficient storage unit into the FIR filter coefficient having the same transfer function as the IIR filter coefficient.

* * * * *